(12) United States Patent
Yamaguchi et al.

(10) Patent No.: US 7,312,621 B2
(45) Date of Patent: Dec. 25, 2007

(54) SEMICONDUCTOR TEST UNIT HAVING LOW CONTACT RESISTANCE WITH EXAMINED ELECTRONIC PRODUCTS, SEMICONDUCTOR CONTACT BOARD, METHOD FOR TESTING SEMICONDUCTOR DEVICE, SEMICONDUCTOR DEVICE, AND METHOD FOR MANUFACTURING THEREOF

(75) Inventors: Naoko Yamaguchi, Yokohama (JP); Yoshiaki Sugizaki, Yokohama (JP); Hideo Aoki, Yokohama (JP); Toshiro Hiraoka, Yokohama (JP); Yasuyuki Hotta, Tokyo (JP); Shigeru Matake, Yokohama (JP); Misa Sawanobori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1047 days.

(21) Appl. No.: 10/401,871

(22) Filed: Mar. 31, 2003

(65) Prior Publication Data
US 2004/0205402 A1 Oct. 14, 2004

(30) Foreign Application Priority Data
Mar. 29, 2002 (JP) ............................ P2002-093673

(51) Int. Cl.
*G01R 31/02* (2006.01)
(52) U.S. Cl. ..................................................... 324/765
(58) Field of Classification Search ........ 324/754–765, 324/158.1; 438/14–17; 702/120–122
See application file for complete search history.

(56) References Cited
U.S. PATENT DOCUMENTS 4,496,903 A * 1/1985 Paulinski .................... 324/761
5,498,467 A * 3/1996 Meola ........................ 428/198
5,602,491 A * 2/1997 Vasquez et al. ............. 324/760
5,830,565 A * 11/1998 Budnaitis .................... 324/750
6,046,060 A    4/2000 Budnaitis (Continued)

FOREIGN PATENT DOCUMENTS

JP          55-161306         12/1980

(Continued)

OTHER PUBLICATIONS

U.S. Appl. No. 09/808,233, filed Mar. 15, 2001, Hotta et al.

(Continued)

*Primary Examiner*—Vinh P. Nguyen
(74) *Attorney, Agent, or Firm*—Oblon, Spivak, McClelland, Maier & Neustadt, P.C.

(57) ABSTRACT

A semiconductor test unit comprises a test circuit for inputting/outputting a test signal to/from an examined electronic product, a test signal wiring electrically connected to the test circuit, a contact board electrically connected to an electrode of the examined electronic product and provided with an electrically conductive via to which the test signal is transmitted, a multilayer circuit board electrically connected to the conductive via and the test signal wiring, located under the bottom face of the contact board, and provided with at least one through-hole, and a vacuum attachment mechanism for attaching thereto and holding the examined electronic product, the contact board, and the multilayer circuit board by vacuum. The contact board is made of an insulative material, has top and bottom faces, and is provided with at least one through-hole.

12 Claims, 9 Drawing Sheets

U.S. PATENT DOCUMENTS 6,246,249 B1 * 6/2001 Fukasawa et al. .......... 324/765
6,465,742 B1 10/2002 Hiraoka et al.

FOREIGN PATENT DOCUMENTS

JP 10-284556 10/1998

OTHER PUBLICATIONS

U.S. Appl. No. 10/251,825, filed Sep. 23, 2002, Hiraoka et al.
U.S. Appl. No. 10/401,871, filed Mar. 31, 2003, Yamaguchi et al.
U.S. Appl. No. 10/694,776, filed Oct. 29, 2003, Hiraoka et al.

* cited by examiner

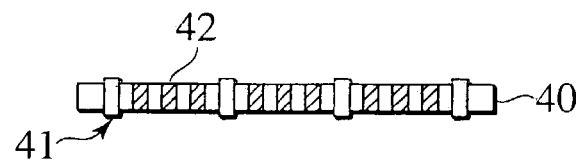
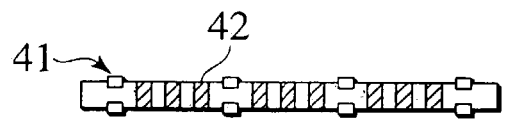
FIG.9A
FIG.9B
FIG.9C  FIG.9D  FIG.9E
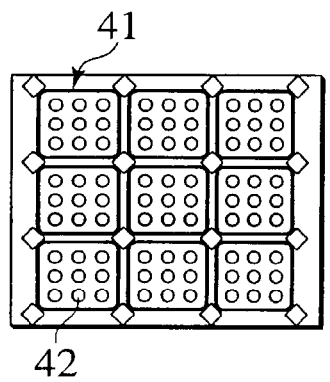
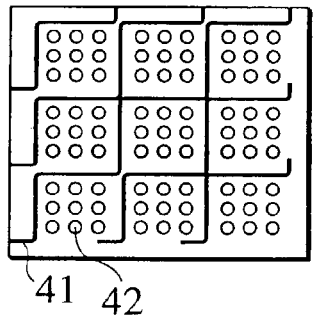
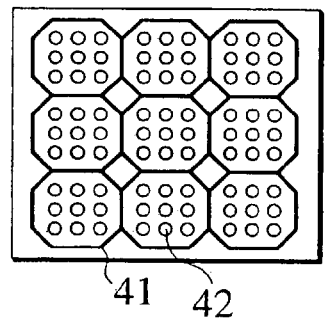
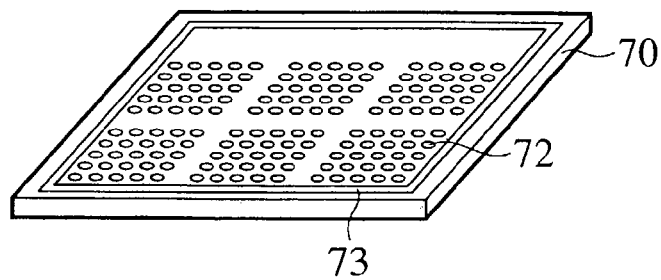
FIG.10
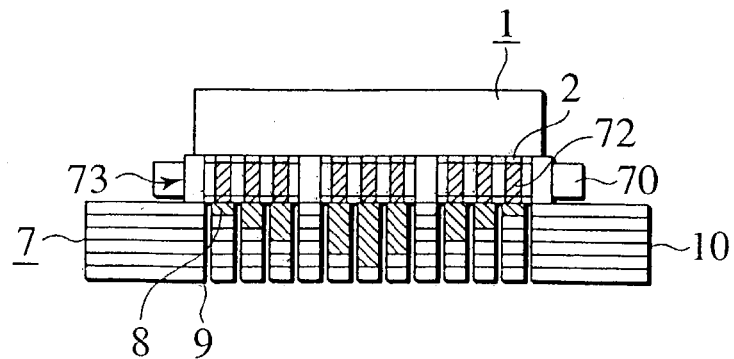
FIG.11

SEMICONDUCTOR TEST UNIT HAVING LOW CONTACT RESISTANCE WITH EXAMINED ELECTRONIC PRODUCTS, SEMICONDUCTOR CONTACT BOARD, METHOD FOR TESTING SEMICONDUCTOR DEVICE, SEMICONDUCTOR DEVICE, AND METHOD FOR MANUFACTURING THEREOF

CROSS REFERENCE TO RELATED APPLICATIONS

This application is based upon and claims the benefit of priority from the prior Japanese Patent Applications No. P2002-093673, filed on Mar. 29, 2002; the entire contents of which are incorporated herein by reference.

BACKGROUND OF THE INVENTION

1. Field of the Invention

The present invention relates to a semiconductor device testing technique. Particularly, the present invention relates to a semiconductor test unit for use in a reliability test and the like for a semiconductor device such as a burn-in, a contact board for a semiconductor device test, a method of testing a semiconductor device, and a method of manufacturing the same.

2. Description of the Related Art

Semiconductor devices must be tested for their product lives at their trial stages or after being manufactured as actual products in development processes and mass production processes. In general, reliable tests are performed while placing the semiconductor devices under various environments. In a general semiconductor testing process, an electrical characteristic test is conducted on a semiconductor wafer in which electric circuits compose of semiconductor elements and the like are formed, thereby screening semiconductor chips into good and defective ones. Next, the wafer is divided into each chip by dicing, and then the chips are assembled into packaged states. Furthermore, the packages are screened into good and defective ones by an electrical characteristic test. Next, a burn-in test (high temperature bias test) is conducted to perform reliability screening. The burn-in test is conducted at one hundred and tens of degrees Celsius for tens of hours to one hundred and tens of hours in order to screen out initial failures including the gate oxide film breakdown of transistors and the breakage or short circuit of wirings of semiconductor elements. After the burn-in test, an electrical characteristic test is conducted as the final test. As a conventional reliability test of semiconductor devices, a test requiring a long time for assembling semiconductor chips into a package has been known. In a general semiconductor test process, the costs for assembling chips having no reliability problems are a problem. Particularly, in the case where many chips are mounted in one package such as a multi chip module (MCM) or where a bare die for COB (Chip On Board) must be supplied, the KGD (Known Good Die) technology is necessary, and it is preferable to conduct a burn-in test before an assembly process.

On the other hand, it is also possible to conduct a chip level burn-in test by accommodating each diced chip in a temporal package. However, a chip level burn-in test has a problem that costs, the number of steps, and processing time increase because of the adoption of the KGD technology. Therefore, a wafer level burn-in test has been proposed. As described in Japanese Unexamined Patent Publication No. Hei 10(1998)-284556 and the like, in a wafer level burn-in test, on a support a wafer is held with an element forming surface facing upward, where electrodes are formed, and the following burn-in system is used. The burn-in system has a multilayer sheet having protruding electrodes at the positions facing the electrodes provided on the wafer, a conductive soft member at the positions facing the electrodes, a burn-in base substrate unit showing high flatness, in which a test circuit are formed, and a mechanism for applying pressure.

In the conventional semiconductor test unit as described above, there are the following problems. In the wafer level burn-in test, high pressure needs to be applied because of variations in the heights of electrode bumps provided on the wafer. In the case of a thin wafer, a load is locally applied to the wafer, and there is a risk that the wafer may be cracked or broken when high pressure is applied thereto. In addition, though a multilayer sheet is provided with conductive portions, as electrodes having lengths of 50 µm with a fine pitch of 100 µm so as to correspond to the electrodes, there may be a case where a sufficient contact area cannot be obtained when the pitch between the electrodes is narrowed and the electrode size is reduced. Particularly, if the electrodes of the wafer, which is an examined electronic product, have inequalities in height, or if the wafer is warped by its weight, a stable test result cannot be obtained. This is because the contact areas to the electrodes of a test board largely differ depending on the electrodes of the wafer even if the wafer is pressed to the test board with strong pressure. In the conventional burn-in system, in order to allow all electrodes on the wafer to simultaneously contact with the electrodes of the test board, application of a local load to the wafer must be avoided. In other words, high flatness is strictly required for the substrate unit. Furthermore, in order to ease the position deviation among electrodes and mechanical stresses due to the difference between the thermal expansion coefficient of the base unit and that of the wafer, two components, which are a multilayer sheet and a member, are necessary. Since the components, i.e. the multilayer sheet and the member, are basically expendables, the cost for members increases.

SUMMARY OF THE INVENTION

A semiconductor test unit comprises a test circuit for inputting/outputting a test signal to/from an examined electronic product, a test signal wiring electrically connected to the test circuit, a contact board electrically connected to an electrode of the examined electronic product and provided with an electrically conductive via to which the test signal is transmitted, a multilayer circuit board electrically connected to the conductive via and the test signal wiring, located under the bottom face of the contact board, and provided with at least one through-hole, and a vacuum attachment mechanism for attaching thereto and holding the examined electronic product, the contact board, and the multilayer circuit board by vacuum. The contact board is made of an insulative material, has top and bottom faces, and is provided with at least one through-hole.

BRIEF DESCRIPTION OF DRAWINGS

FIG. 9A is an example of a cross-sectional view of the contact board according to the third embodiment of the present invention.

FIG. 9B is an example of a cross-sectional view of the contact board according to the third embodiment of the present invention.

FIG. 9C is an example of a top view of the contact board according to the third embodiment of the present invention.

FIG. 9D is an example of a top view of the contact board according to the third embodiment of the present invention.

FIG. 9E is an example of a top view of the contact board according to the third embodiment of the present invention.

FIG. 10 is a perspective view of a contact board according to a fourth embodiment of the present invention.

FIG. 11 is a cross-sectional view of a semiconductor test unit according to the fourth embodiment of the present invention.

DETAILED DESCRIPTION OF THE INVENTION

Figure 1:
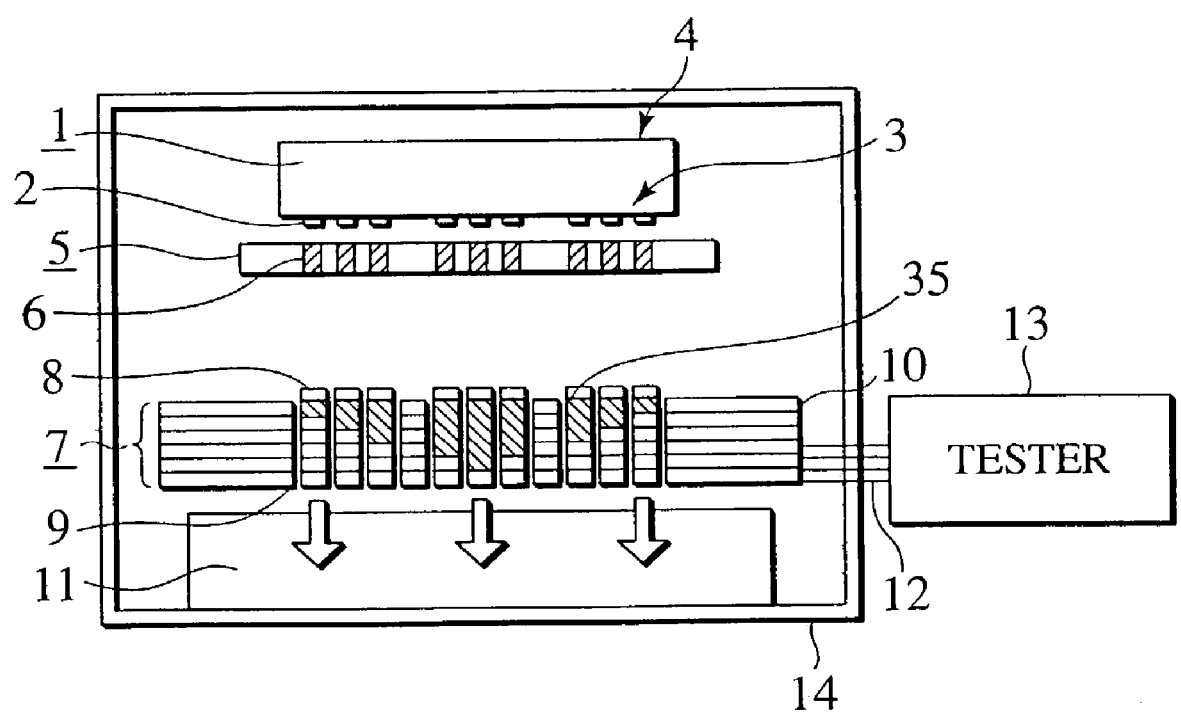
FIG. 1 is a cross-sectional view of a semiconductor test unit according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

In the following descriptions, numerous specific details are set fourth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

First Embodiment

A semiconductor test unit and a semiconductor device test contact board according to a first embodiment of the present invention will be described using FIGS. 1 and 2, and FIGS. 3A and 3B. As shown in FIG. 1, a semiconductor wafer 1, which is an examined electronic product to be tested, has many electrodes 2 provided on the surface of the wafer element-side 3. The opposite side of the wafer element-side 3 of the semiconductor wafer 1 is a wafer backside 4. A contact board (contact sheet) 5 is placed below the semiconductor wafer 1. The contact board 5 has top and bottom faces. Vias 6 are provided extending from the top face to the bottom face of the contact board 5, and are electrically and mechanically connected to respective electrodes 2 of the semiconductor wafer 1. The vias 6 are provided in the contact board 5 at the same positions as those of the electrodes 2 of the semiconductor wafer 1, which is an examined electronic product. That is, the vias 6 are provided at the positions facing the electrodes 2 of the semiconductor wafer 1.

Below the contact board 5, a multilayer circuit board 7 is placed. Wirings 10 are provided on the surface of and inside the multilayer circuit board 7, and are electrically connected to the vias 6. At the positions facing the vias 6, electrode terminals 8 are provided on the top surface of the multilayer circuit board 7. Through-holes 9 are provided in portions where the electrode terminals 8 are not provided. The through-holes 9 extend from the top face to the bottom face of the multilayer circuit board 7. The electrode terminals 8 are connected to a test circuit 13 through the wirings 10 by use of test signal wirings 12. In the multilayer circuit board 7, wirings 10 constituting a multilayer structure are provided. The wirings 10 are connected one-to-one to vertical wirings 35 provided vertically passing through the multilayer circuit board 7. The lengths of the vertical wirings 35 are set in accordance with the positions of the wirings 10 connected thereto.

The semiconductor wafer 1, the contact board 5, and the multilayer circuit board 7 are fixed by a vacuum attachment mechanism 11. Specifically, each component is fixed by vacuum attaching power passing through the contact board 5 and with vacuum attaching and holding power through the through-holes 9 passing through the top and bottom faces of the multilayer circuit board 7. For example, the vacuum attaching power is indicated by down arrows in FIG. 1. The semiconductor wafer 1, the contact board 5, the multilayer circuit board 7, and the vacuum attachment mechanism 11 are surrounded by an outer casing 14.

If the semiconductor test unit is a burn-in system, an element (not shown) for heating atmosphere supplying heat to the examined electronic product is contained in the outer casing 14 in order to raise the temperature of the examined electronic product to a desired burn-in temperature. Alternatively, an exothermic mechanism (not shown) or a radiating mechanism (not shown) for heat generated in the semiconductor wafer or the like is disposed therein. Moreover, the vacuum attachment mechanism 11 may be constituted using a metal box as a stage for mounting the multilayer circuit board 7. The multilayer circuit board 7 is firmly attached by vacuum through holes and grooves provided in a receiving portion of the multilayer circuit board 7. The multilayer circuit board 7 may be firmly attached by vacuum by disposing a porous ceramic plate in the receiving portion of the multilayer circuit board 7.

Figure 2:
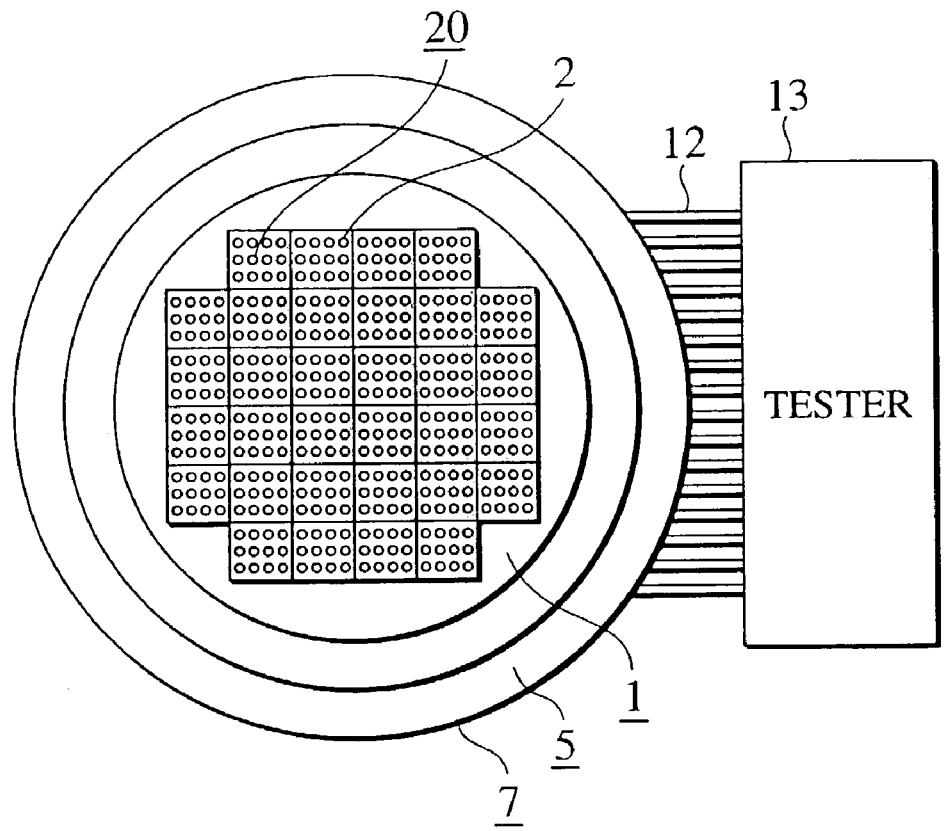
FIG. 2 is a top view of the semiconductor test unit according to the first embodiment of the present invention.

A top view showing the structure inside the outer casing of the semiconductor test unit is shown in FIG. 2. Here, the electrodes 2 of the semiconductor wafer 1 are prospectively shown. That is, the electrodes 2 of the semiconductor wafer 1 are provided facing the top face of the contact board 5 as shown in the cross-sectional view of FIG. 1, and therefore cannot be observed from the top actually. An identical number of electrodes 2 of the semiconductor wafer are provided in an identical arrangement for each of a plurality of semiconductor chips 20 provided on the semiconductor wafer. Below the contact board 5, the multilayer circuit board 7 is placed. The contact board 5 may be a quadrangle in addition to a disk snape as shown. Moreover, the outer shape of the contact board 5 may be of any easily handled shape as long as the vias are arranged so as to coincide with the electrodes of the examined electronic product.

Figure 3A:
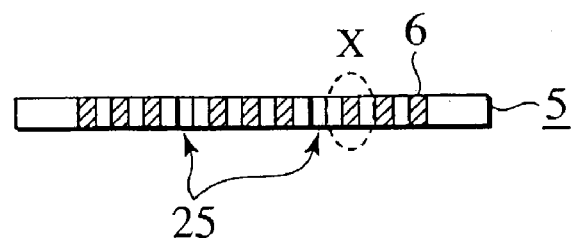
FIG. 3A is a cross-sectional view of a contact board according to the first embodiment of the present invention.
Figure 3B:
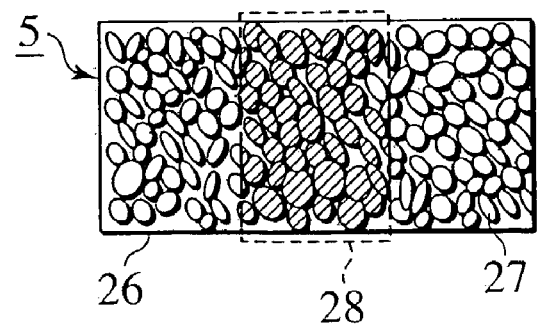
FIG. 3B is a partially enlarged cross-sectional view of the contact board according to the first embodiment of the present invention.

Next, the structure of the contact board 5 will be described using FIGS. 3A and 3B. As shown in FIG. 3A, through-holes 25 passing through the top and bottom faces of the contact board 5 are provided among the plurality of vias 6 in the cross section of the contact board 5. As shown as a cross-sectional view in FIG. 3B, which is an enlarged view of a part X in FIG. 3A, the contact board 5 is made of a porous sheet material 26 having a random mesh structure. In the sheet material 26, many pores 27 are provided. The pores 27 are provided over the entire sheet material 26, not only in this cross-section.

In via portions 28, the vias 6 in which electrically conductive metal, e.g. copper, is filled in pores 27 are formed. The pores 27 have portions formed so as to contact with one another, and the vias 6 extending from the top face to the bottom face of the contact board 5 are formed. Very favorable vacuum attaching power can be obtained by using, as a sheet material for the contact board 5, an electrically insulative porous (mesh) sheet made of, for example, polytetrafluoroethylene (PTFE), polyimide, or liquid crystal polymer containing aramid. A porous sheet has good air permeability and also absorbs the unevenness of the surfaces of the contact board 5 and the semiconductor wafer 1 by elasticity. For example, pores provided in the contact board 5 at an open area ratio of 70% to 80% enables sufficient transfer of air pressure between the top and bottom faces of the contact board 5. Moreover, it is expected to obtain an effect of absorbing the difference in thermal expansion coefficient with the semiconductor wafer 1 to prevent the position deviation among the electrodes 2 by the flexure of the sheet portion, except for the vias 6, during burn-in heating.

Although copper is used as material for wiring and vias, other low-resistance electrically conductive material can be used. If a porous sheet material 26 is used as the contact board 5, the step of providing openings in the via portions 28 for forming the vias 6 becomes unnecessary. Moreover, the shape of a via may be an arbitrary shape such as a circular shape, a rectangular shape, a conic shape, or a trapezoidal shape. Alternatively, instead of a porous sheet, a high open area ratio of sheet provided with many through-holes can be used. Moreover, as shown in FIG. 3B, if the contact board is provided with many pores to enable to realize a vacuum-attachable state, through-holes do not need to be provided.

In order to give versatility to the contact board, vias equal to/more than the number of electrodes of the examined electronic product are provided so as to be usable for a plurality of kinds of examined electronic products. Moreover, providing of the through-holes 9 which are provided in the multilayer circuit board 7, at the same positions as those of the through-holes 25 of the contact board 5 is suitable for gas flow. The multilayer circuit board 7 may have any structure as long as air pressure can be vertically transferred by the passage of gas through many opening portions provided in portions except for the wiring portions used as the wirings.

The vacuum attaching power of the vacuum attachment mechanism, which is for conducting a burn-in test in which an examined electronic product is subjected to high temperature to be tested for electric characteristics, may be arbitrary as long as it is sufficient to tightly attach the examined electronic product to the contact board as well as tightly attach the contact board to the multilayer circuit board and to obtain a contact area capable of allowing an electric current to flow with a low resistance from the test circuit to a test signal input/output terminals of the examined electronic product.

According to the present embodiment, necessary vias and wirings can be realized by placing a circuit board under the contact board even when the number of electrodes of an examined electronic product is large. In addition, a stable test result can be obtained by contacting the electrodes of an examined electronic product with the electrodes of the contact board with uniform pressure over the entire surfaces thereof by vacuum attaching power even when the examined electronic product is large.

As previously mentioned, in a semiconductor test unit, it is possible to apply equal loads between the electrodes of a semiconductor wafer and the bumps of a contact board without pressure control for the semiconductor wafer and a test board by adopting a porous substance as the contact board used for the electric connection between the semiconductor wafer and a test circuit and providing a vacuum attachment mechanism in a stage for receiving the contact board. Thus, a stable electric connection can be easily obtained.

Particularly, in the present embodiment, since vacuum attaching power is utilized when the electrodes of the semiconductor wafer and the bumps of the contact board are contacted with each other, uniform loads can be applied to the electrodes on the entire surface of the semiconductor wafer. In this way, equal loads can be applied to the electrodes of a semiconductor wafer, and it is possible to bring electrodes and bumps into contact with each other without giving an excessive load to a semiconductor wafer even in the case of a large-sized thinner semiconductor wafer. Moreover, since the contact board is a porous substance, vacuum attachment can be performed over the entire surface of the contact board, thus making it possible to obtain sufficient contact, in particular, even when the number of electrodes is large.

In the present embodiment, an examined electronic product to be tested is not limited to a semiconductor wafer but may be an electronic device such as a semiconductor chip or a semiconductor device assembled in a package.

As described above, according to the present embodiment, even if the electrodes of a semiconductor wafer, which is an examined electronic product, have unevenness or a semiconductor wafer is warped by its own weight, it is possible to prevent the variation in contact area with the bumps of the contact board among the electrodes of a semiconductor wafer to obtain a stable test result. It is because the semiconductor wafer is pressed to the contact board with uniform vacuum attaching power over the entire semiconductor wafer surface where the electrodes are formed. In addition, it is possible to reduce the number of manufacturing steps for a test and the number of parts and materials for a test unit compared to a conventional wafer level burn-in test unit.

Modification of First Embodiment

Figure 4:
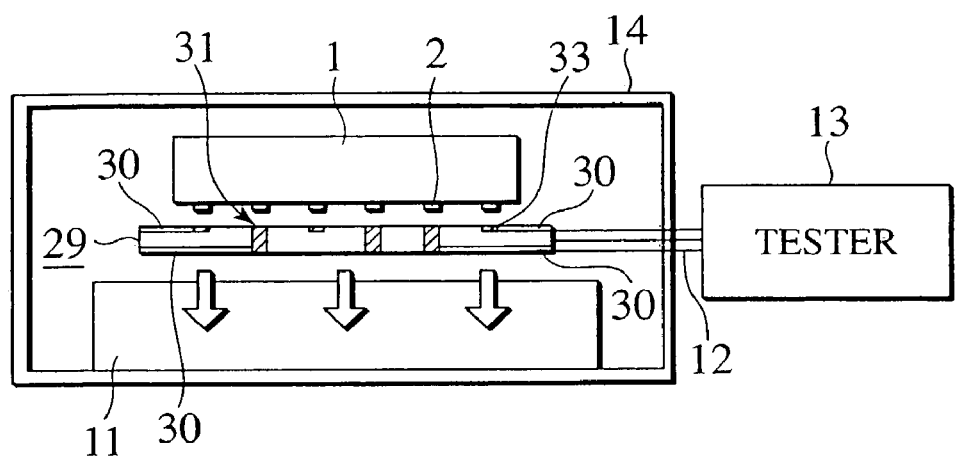
FIG. 4 is a cross-sectional view of a semiconductor test unit according to a modification of the first embodiment of the present invention.

In the present modification, a semiconductor test unit having a structure as shown in FIG. 4 is provided. The structure of a contact board is different from that of the first embodiment, and a multilayer circuit board is not used. However, except for these, the semiconductor test unit of the present modification has a similar structure to that of the first embodiment. The contact board 29 has top and bottom faces, and wirings 30 are provided in the top and bottom faces of the contact board 29. Vias 31 connected one-to-one to the wirings 30 are provided extending from the top face toward the bottom face of the contact board 29. However, among the vias 31, there may exist electrode vias 33 which are located only in the top face of the contact board 29 and not provided passing through the contact board 29 to the bottom face. These electrode vias 33 provided only in the top face of the contact board 29 are connected to the wirings 30 provided in the top face of the contact board 29. The vias 31 and the electrode vias 33 are electrically and mechanically connected to the electrodes 2 of a semiconductor wafer 1, respectively. That is, the vias 31 are correspondingly provided at the same positions as those of the electrodes 2 of the semiconductor wafer 1, which is an examined electronic product.

The wirings 30 are connected to a test circuit 13 through test signal wirings 12. The semiconductor wafer 1 and the contact board 29 are fixed with a vacuum attachment mechanism 11 by vacuum attaching and holding power through through-holes passing through the top and bottom faces of the contact board 29, or through pores in a porous substance in the case where the contact board 29 is constituted by a porous substance. Incidentally, in the present modification, copper is also filled in pores in the contact board 29 to form the vias 31 in the case where the contact board 29 is constituted by a porous substance.

As described above, when the number of electrodes of an examined electronic product is relatively small, or when the intervals of electrodes of an examined electronic product are large, it is possible to arrange wirings in the top and bottom faces of the contact board 29 to connect the lines to the test signal lines 12 as the present modification. In this case, a multilayer circuit board is not necessary unlike the first embodiment, thus making it possible to reduce the number of parts for a semiconductor test unit.

Second Embodiment

Figure 5:
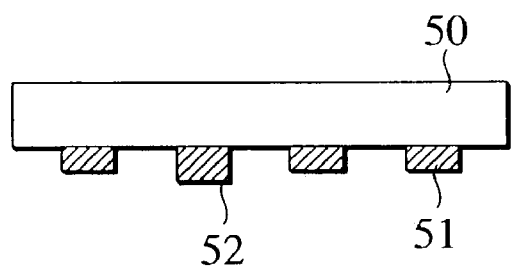
FIG. 5 is a cross-sectional view of an examined electronic product according to a second embodiment of the present invention.

A semiconductor test unit and a semiconductor device test contact board according to the present embodiment will be described using FIGS. 5 and 6 and FIGS. 7A to 7G. In FIG. 5, a partial cross-sectional view of a semiconductor wafer 50, which is an examined electronic product, is shown. A plurality of electrodes 51 and a high-load electrode 52 are provided on the bottom face of the semiconductor wafer 50. A large load is assigned to the surface of the high-load electrode 52 compared to the other electrodes 51. The high-load electrode 52 appears, for example, when the height thereof is higher than those of the other electrodes 51, or when the area around the high-load electrode 52 is protruded due to the deformation of an examined electronic product. When a test is conducted on a semiconductor wafer having such a high-load electrode by adopting the contact board of the first embodiment, there is a risk that impact on the high-load electrode and a contact failure between other electrode and a via of the contact board might occur.

Figure 6:
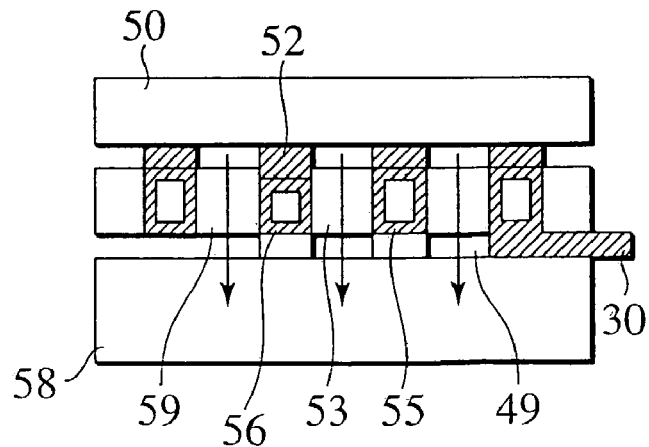
FIG. 6 is a cross-sectional view showing a semiconductor test unit according to the second embodiment of the present invention.

In the present embodiment, a contact board of which cross section is as shown in FIG. 6 is used when an examined electronic product, having such a high-load electrode, is tested. A contact board 53 is placed under a semiconductor wafer 50, which is an examined electronic product. This contact board 53 has top and bottom faces. Vias 55 provided extending from the top face to the bottom face of the contact board 53 are electrically and mechanically connected to the electrodes 51 of the semiconductor wafer 50, respectively. These vias 55 each have a hollow cylindrical shape. Under the high-load electrode 52, a compressed via 56 of which shape is compressed compared to the other vias 55 is electrically and mechanically connected thereto.

These vias 55 and compressed via 56 are electrically connected to wirings 30 formed in the bottom or top faces of the contact board 53. The contact board 53 has the vias 55 provided at the same positions as those of the electrodes 51 of the semiconductor wafer 50, which is an examined electronic product. The semiconductor wafer 50 and the contact board 53 are fixed with a vacuum attachment mechanism 58 by vacuum attaching and holding power through through-holes 59 passing through the top and bottom faces of the contact board 53 and through through-holes 49 around the wirings 30. This vacuum attaching power is indicated by down arrows in FIG. 6. These semiconductor wafer 50, electrodes 51, and vacuum attachment mechanism 58 are contained in an outer casing (not shown).

Next, the shapes of the vias used in the present embodiment will be described using FIG. 6 and FIGS. 7A to 7G, which are cross-sectional views thereof. As shown in FIG. 6, in the vias 55 formed in the contact board 53, copper is filled in pores of the contact board 53 by plating. Since the vias 55 are hollowed out, the vias 55 themselves have functions similar to those of compressible springs. Therefore, the vias easily dent when stressed. Thus, it is possible to buffer stresses and impact on the electrodes 51 of the semiconductor wafer 50 and the vias 55 of the contact board 53.

Figure 7A:
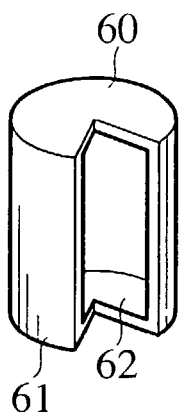
FIG. 7A is an example of a perspective view of a via according to the second embodiment of the present invention.

In the case where the vias are hollow, the shapes of the vias may be a shape obtained by partially cutting out the lateral face of a cylinder hollow as shown in FIG. 7A, other than a cylindrical shape. That is, contact faces 60 are provided at the top and bottom of a via, the contact faces 60 are connected by a coupling face 61, and a cavity 62 is provided in part of the coupling face 61.

Figure 7B:
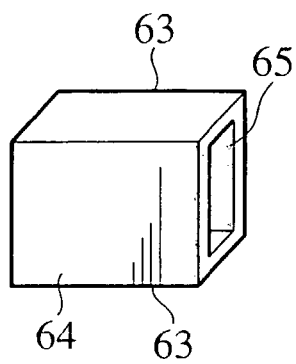
FIG. 7B is an example of a perspective view of a via according to the second embodiment of the present invention.

Alternatively, as shown in FIG. 7B, a shape obtained by partially cutting out the lateral face of a square pole may be adopted. That is, contact faces 63 are provided at the top and bottom of a via, the contact faces 63 are connected by a coupling face 64, and a cavity 65 is provided in part of the coupling face 64.

Figure 7C:
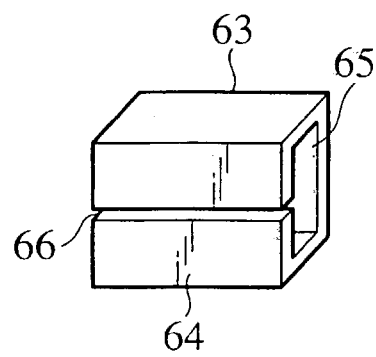
FIG. 7C is an example of a perspective view of a via according to the second embodiment of the present invention.

Instead, as shown in FIG. 7C, a shape obtained by further providing a slit 66 in part of the coupling face 64 in the shape shown in FIG. 7B, which is obtained by partially cutting out the lateral face of a square pole.

Figure 7D:
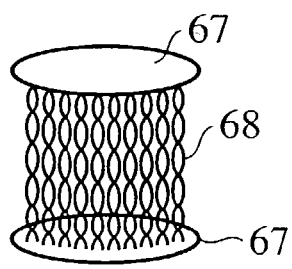
FIG. 7D is an example of a perspective view of a via according to the second embodiment of the present invention.

Further, as shown in FIG. 7D, a plated mesh structure may be adopted. That is, contact faces 67 are provided at the top and bottom of a via, the contact faces 6 are connected by a thread-like coupling member 68, and a cavity is provided inside the coupling member 68.

Figure 7E:
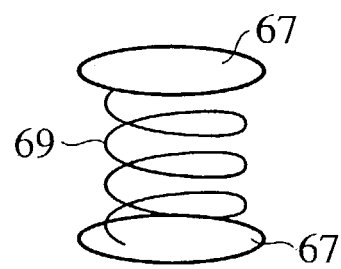
FIG. 7E is an example of a perspective view of a via according to the second embodiment of the present invention.

Moreover, as shown in FIG. 7E, a shape in which a spring-shaped coupling member 69 connects top and bottom contact faces 67 may be adopted.

Figure 7F:
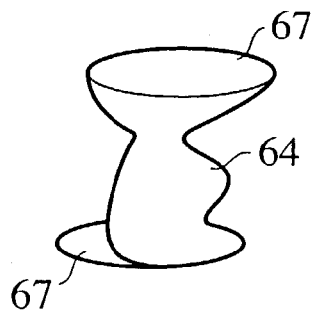
FIG. 7F is an example of a perspective view of a via according to the second embodiment of the present invention.

Furthermore, as shown in FIG. 7F, a shape in which top and bottom contact faces 67 are vertically dislocated from each other and partially connected by a coupling face 64 in an S shape may be adopted.

Figure 7G:
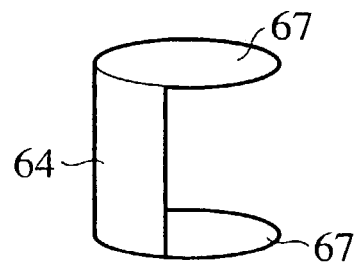
FIG. 7G is an example of a perspective view of a via according to the second embodiment of the present invention.

In addition, as shown in FIG. 7G, a shape in which top and bottom contact faces 67 are partially connected by a columnar coupling face 64 may be adopted.

By using a contact board thus constituted in the semiconductor device test unit of the first embodiment, a similar effect to that of the first embodiment can be obtained.

Note that the contact board of the present embodiment can be applied to a semiconductor test unit provided with a vacuum attachment mechanism as shown in FIG. 1, and also applied to a semiconductor test unit of a type in which a contact board is placed on a stage and a vacuum attachment mechanism is not provided.

Furthermore, according to the semiconductor device test contact board of the present embodiment, a stress buffering effect on wafer electrodes can be obtained by contriving the elasticity of the contact board and a via shape.

Third Embodiment

Figure 8:
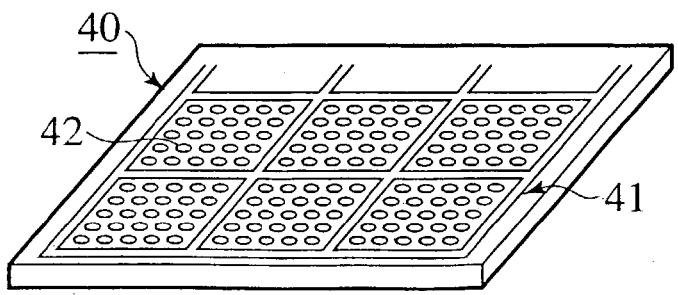
FIG. 8 is a perspective view of a contact board according to a third embodiment of the present invention.

A semiconductor device test contact board of the present embodiment will be described using FIG. 8. PTFE and polyimide, which are conceivable materials for the contact board used in the first embodiment, have very large thermal expansion coefficients compared to semiconductor wafers. In a burn-in test, the atmosphere in a semiconductor test unit reaches temperature as high as 125° C. due to the heat generated in a semiconductor wafer or the like. Therefore, a contact board is deformed, and the dislocation among electrodes is worried. In the present embodiment, in order to solve such a problem, low thermal expansion coefficient material, such as Ni, is partially plated on the contact side of the contact board 40 with a semiconductor wafer to form a deformation suppression portion 41 as shown in FIG. 8. Since this deformation suppression portion 41 is provided in a region except for the region where vias 42 are formed, the deformation suppression portion 41 does not affect the connection between a semiconductor wafer and the contact board.

Providing the deformation suppression portion 41 suppresses the thermal expansion of the contact board 40 and makes it possible to maintain electric connection. Here, though the contact board 40 has a rectangular shape in FIG. 8, other shape may be adopted. Note that it is preferable that the contact board is constituted in accordance with the whole shape of an examined electronic product.

The cross-sectional structure of the contact board will be described using FIG. 9. In the example shown in FIG. 9A, the deformation suppression portion 41 is provided passing through the top and bottom faces of the contact board 40, and the plurality of vias 42 are provided passing through the top and bottom faces of the contact board 40 so that the vias 42 may be surrounded by the deformation suppression portion 41. Alternatively, as shown in FIG. 9B, the deformation suppression portion 41 may be formed only on the surfaces of the top and bottom faces of the contact board 40.

Next, the shape of the deformation suppression portion 41 of the contact board 40 is not limited to be grid-shaped shown in FIG. 8. As long as the deformation suppression portion 41 has a mutually connected and monolithic shape, the deformation suppression portion 41 may be formed in the form of a grid so as to surround the vias 42 as shown in FIG. 9C, or constituted in a wavelike shape as shown in FIG. 9D. Further, the deformation suppression portion 41 may have a chain structure as shown in FIG. 9E. That is, a plurality of deformation suppression portions may be provided so that each deformation suppression portion may surround a certain number of vias and may be connected to each other. Thus, the effect of suppressing the deformation of the contact board is strengthened by increasing the density of the deformation suppression portion.

Here, in order to suppress the deformation of the contact board, it is preferable that the deformation suppression portion formed on the contact board is made of material for suppressing thermal expansion so that the thermal expansion coefficient of the entire contact board may be within a range of +6 ppm/K with an examined electronic product. The deformation suppression portion can be formed by plating metal having a low thermal expansion coefficient on the contact board or compregnating the contact board.

The material constituting the deformation suppression portion may be metal such as Cu, Au, or Sn, other than Ni.

Further, instead of Ni, the material constituting the deformation suppression portion may be resin. For example, resins often used for an insulator of a printed circuit board heretofore, such as epoxy resin, bis-maleimide-triazine resin, PEEK resin, and butadiene resin, can be used. In addition, polyolefins including polyethylene and polypropylene; polydienes including polybutadiene, polyisoprene, and polyvinylethylene; acrylic resins including polymethylacrylate and polymethyl methacrylate; polystyrene derivatives; polyacrylonitrile derivatives including polyacrylonitrile and polymethacrylonitrile; polyacetals including polyoxymethylene; polyesters including polyethylene terephthalate, polybutylene terephthalate, and aromatic polyesters; polyallylates; aromatic polyamides including aramid resin, and polyamides including nylon; polyimides; epoxy resins; aromatic polyethers including poly(p-phenylene ether); polyether sulfones; polysulfones; polysulfides; fluorinated polymers including polytetrafluoroethylene (PTFE); polybenzoxazoles; polybenzothiazoles; polyphenylenes including poly-p-phenylene; poly-p-phenylene vinylene derivatives; polysiloxane derivatives; novolak resins; melamine resins; urethane resins; polycarbodimide resins; and the like can be also used.

Moreover, the material constituting the deformation suppression portion may be ceramics, for example, metallic oxides including silica, alumina, titania, and potassium titanate, or metal compounds including silicon carbide, silicon nitride, and aluminum nitride.

By using the contact board of the present embodiment in the semiconductor test unit of the first embodiment, a similar effect to that of the first embodiment can be obtained. Furthermore, it is possible to prevent the dislocation between the electrodes of the contact board and a semiconductor wafer, which is an examined electronic product, due to temperature rise in a test by plating metal having a low thermal expansion coefficient on the contact board or compregnating the contact board in accordance with the thermal expansion coefficient of a wafer as previously mentioned.

Fourth Embodiment

In each embodiment previously mentioned, there are cases where bumps, BGA balls, or the like having a high height are formed on the electrodes of a semiconductor wafer, which is an examined electronic product in a test, such as a burn-in. In such cases, step gaps cannot be absorbed only by the elasticity of a contact board, and sufficient vacuum attaching power cannot be obtained. That is, a thin contact board having a thickness of some tens of μm to 100 μm cannot dent sufficiently for absorbing the convex portion of a high electrode having a height equal to or higher than the thickness of the contact board. In that case, pressure leaks from the interspace between the contact board and the semiconductor wafer, and the semiconductor wafer cannot be connected to the electrodes of the contact board with sufficient vacuum attaching power. A semiconductor device test contact board according to the present embodiment suppresses such a phenomenon.

In FIG. 10, a perspective view of the contact board of the present embodiment is shown. The contact board 70 has vias 72 provided extending from the top face to the bottom face thereof. A protruding portion 73 is provided on the top face outside the outermost vias among the vias 72. This protruding portion 73 is made of material such as resin, ceramic, or metal. The protruding portion 73 is provided on the contact board 70, for suppressing the air leak in accordance with the shape of a semiconductor wafer, which is an examined electronic product and mounted on the contact board 70. Note that the protruding portion 73 may be provided on the bottom face.

In FIG. 11 showing the cross section of the contact board 70 in the state where an examined electronic product is mounted thereon, the protruding portion 73 contacts with the bottom face of the peripheral portion of the semiconductor wafer 1 to prevent the air leak between the semiconductor wafer 1 and the contact board 70. Furthermore, on a multilayer circuit board 7 having the contact board 70 mounted thereon, the protruding portion 73 prevent the air leak between the contact board 70 and the multilayer circuit board 7. Note that the protruding portion 73 is provided only at the outer circumference of the contact board 70 in FIG. 10, but that a structure in which the protruding portion 73 is also provided inside the contact board at constant intervals is shown in the cross section of FIG. 11.

Incidentally, the contact board 70 has a similar structure to that of the contact board in First Embodiment, except for the fact that the protruding portion 73 is provided.

Here, providing the protruding portion 73 in a shape that completely covers the outer circumference of the semiconductor wafer 1 is necessary for preventing the air leak. Since the protruding portion 73 is provided in a region except for the region where the vias 72 are formed, the protruding portion 73 does not affect the connection between the semiconductor wafer 1 and the contact board 70. Here, though the contact board 70 has a rectangular shape in FIG. 10, other shape may be adopted. Note that it is preferable that the contact board is constituted in accordance with the whole shape of an examined electronic product.

Figure 12A:
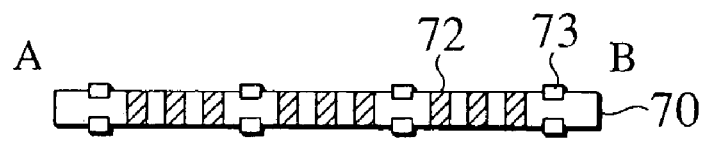
FIG. 12A is an example of a cross-sectional view of the contact board according to the fourth embodiment of the present invention.
Figure 12B:
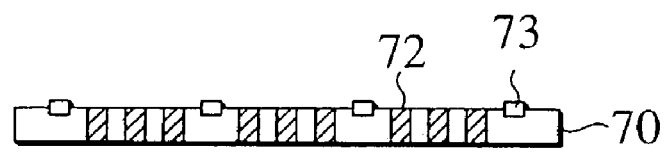
FIG. 12B is an example of a cross-sectional view of the contact board according to the fourth embodiment of the present invention.
Figure 12C:
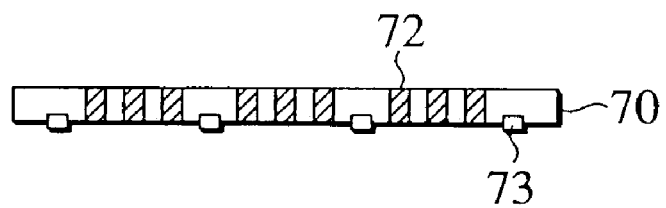
FIG. 12C is an example of a cross-sectional view of the contact board according to the fourth embodiment of the present invention.

Next, the cross-sectional structure of the contact board 70 will be described using FIGS. 12A to 12C. In the example shown in FIG. 12A, protruding portions 73 are provided at the same positions on both top and bottom faces of the contact board 70. In the structure shown in FIG. 12B, an example in which protruding portions 73 are provided only on the top face of the contact board 70 is shown. Moreover, in the structure shown in FIG. 12C, an example in which protruding portions 73 are provided only in the bottom face of the contact board 70 is shown. Thus, in accordance with the inequalities of the electrodes' heights of an examined electronic product or the multilayer circuit board, protruding portions can be provided in any one of only the top face, only the bottom face, or both top and bottom faces of the contact board.

Moreover, the protruding portion 73 having a function of preventing the air leak can be also used as the deformation suppression portion 41 described in the third embodiment. That is, since the deformation suppression portion 41 is formed at the circumference of the contact board 40 as shown in FIG. 8, the deformation suppression portion 41 also functions as a protruding portion for preventing the air leak. In the present embodiment, a similar effect to that of the first embodiment can be also obtained, and furthermore, the air leak is prevented when the height of the protruding portion of an electrode of a semiconductor wafer is large, thus making it possible to obtain sufficient vacuum attaching power for a semiconductor wafer.

Fifth Embodiment

Figure 13A:
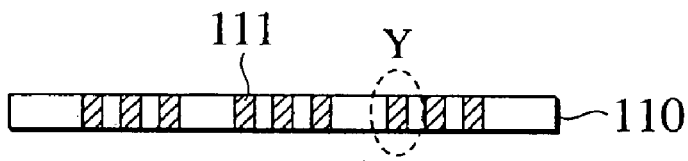
FIG. 13A is a cross-sectional view of a contact board according to a fifth embodiment of the present invention.
Figure 13B:
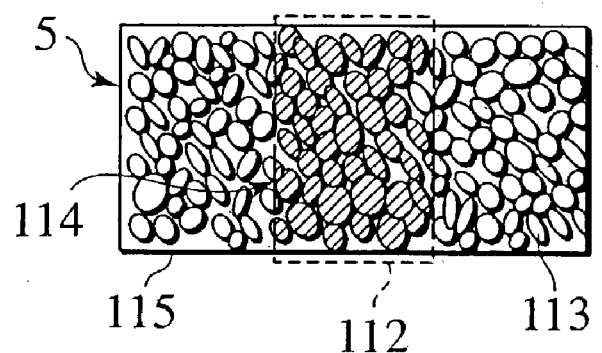
FIG. 13B is a partially enlarged cross-sectional view of the contact board according to the fifth embodiment of the present invention.

The structure of a semiconductor device test contact board of the present embodiment will be described using FIGS. 13A and 13B. In the contact board 110 of which cross-sectional structure is shown in FIG. 13A, a plurality of vias 111 are provided passing through the top and bottom faces of the contact board 110 at constant intervals. These vias 111 are formed at the position facing electrode terminals of an examined electronic product and electrode terminals of a multilayer circuit board.

In this contact board 110, air through-holes for fixing the contact board 110 are not provided in a vacuum attachment mechanism, but the contact board 110 is made of a porous substance so that pores in the porous portion thereof function similarly to through-holes. In FIG. 13B, an enlarged view of the part Y in FIG. 13A is shown. The contact board 110 is made of a sheet material 115, and many pores 113 are provided therein. In a via portion 112, electrically conductive material is filled in the pore portions. Thus, the vias 111 and the sheet material 115 are made integral. As the filled electrically conductive material, copper and the like can be used. Here, since adjacent pores 113 are joined with each other, filled copper is coupled into a continuous body. As a method of filling copper in these pores 113, plating can be utilized.

Sixth Embodiment

A method of testing a semiconductor device in the present embodiment will be described. First, a semiconductor test unit having the structure shown in FIG. 1, which has been described in the first embodiment, is prepared. A contact board 5 having the previously mentioned structure is prepared.

Next, the contact board 5 is attached and connected to the surface of a semiconductor wafer 1, which is an examined electronic product and on which electrodes 2 are formed, in such a manner that vias 6 are located at the positions facing the electrodes 2.

Next, the contact board 5 is mounted on a multilayer circuit board 7. At this time, alignment is performed so that electrode terminals 8 of the multilayer circuit board 7 may be positioned facing the positions of the vias 6 of the contact board 5.

Next, an outer casing 14 is hermetically closed so that the semiconductor wafer 1, the contact board 5, the multilayer circuit board 7, and a vacuum attachment mechanism 11 may be sealed therein. The inside of the semiconductor test unit, which is surrounded by this outer casing 14, is purged with, for example, nitrogen.

Next, the vacuum attachment mechanism 11 is activated to draw a vacuum, the contact between the electrodes 2 of the semiconductor wafer 1 and the vias 6 of the contact board 5 is strengthen to firmly attach one to the other. Thus, the semiconductor wafer 1 and the contact board 5 are tightly attached to each other in the state where the positions thereof do not dislocate from each other.

Next, a temperature controller (not shown) is activated to heat up the semiconductor wafer 1 to a temperature necessary for the test as needed. Alternatively, in certain cases, cooling is performed to a necessary temperature. The semiconductor test unit is thermally insulated from the external environment, thereby making it possible to obtain a temperature necessary for the test.

Thereafter, a test circuit 13 is operated to test the semiconductor wafer 1. Thus, all tests can be conducted in the state of being a wafer.

As described above, in a semiconductor test unit, it is possible to apply equal loads between electrodes of a semiconductor wafer and a contact board without pressure control for the semiconductor wafer and the test board. This is realized by adopting a porous substance as the contact board for use for the electric connection between the semiconductor wafer and a test circuit and by providing a vacuum attachment mechanism in a stage for receiving the contact board. Thus, stable electric contact can be easily obtained.

Particularly, in the present embodiment, since vacuum attaching power is utilized when electrodes of a semiconductor wafer and a contact board are contacted with each other, uniform power can be applied to the entire surface of the semiconductor wafer. Thus, equal loads can be applied to electrodes of a semiconductor wafer, and it is possible to contact electrodes with each other without giving an excessive load to a semiconductor wafer even in the case of a large-sized and thinner semiconductor wafer. Moreover, since the contact board is made of a porous substance, the entire surface of the contact board can be attached by vacuum, thus making it possible to obtain sufficient contact, in particular, even in the case where the number of electrodes is large.

In the present embodiment, an examined electronic product is not limited to a semiconductor wafer and may be an electronic device such as a semiconductor chip or a semiconductor device assembled in a package.

As described above, according to the present embodiment, even if the electrodes of a semiconductor wafer, which is an examined electronic product, has inequalities in height or a semiconductor wafer is warped by its own weight, it is possible to prevent the variation in contact area with the bumps of the contact board among the electrodes of a semiconductor wafer to obtain a stable test result, because the semiconductor wafer is pressed to the contact board with uniform vacuum attaching power over the entire semiconductor wafer surface where the electrodes are formed. In addition, it is possible to reduce the number of manufacturing steps for a test and the number of parts and materials for a test unit compared to a conventional wafer level burn-in test unit.

Modification of Sixth Embodiment

Figure 14:
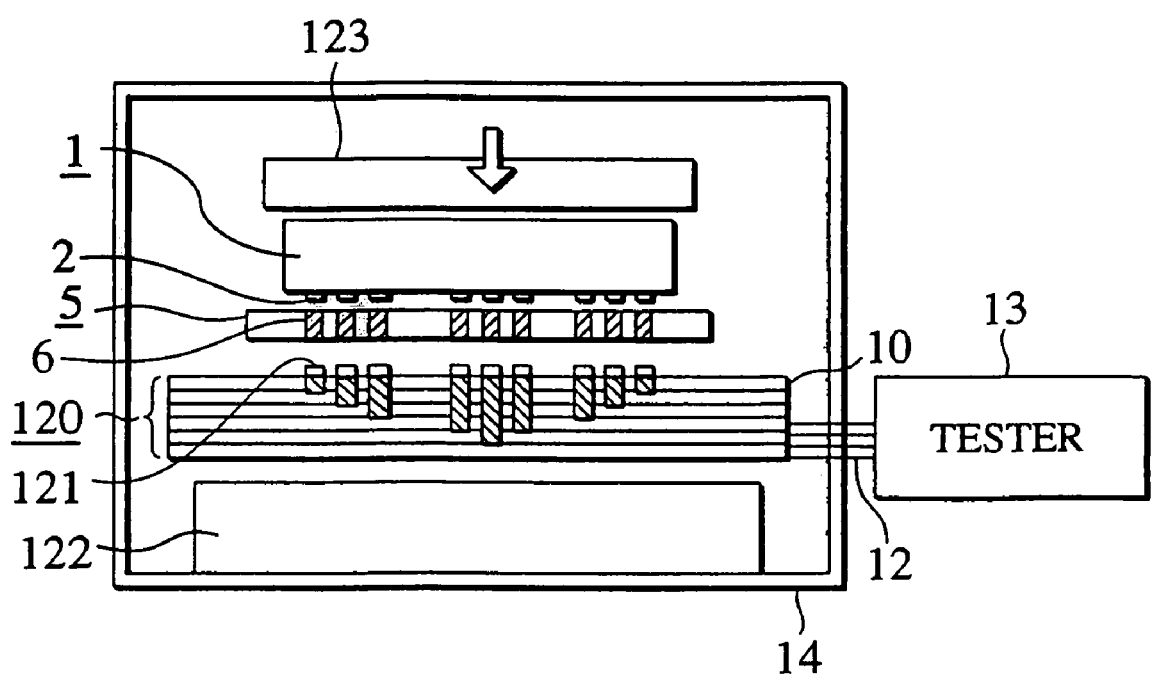
FIG. 14 is a cross-sectional view of a semiconductor test unit according to a modification of a sixth embodiment of the present invention.

In the present modification, a test is conducted using a semiconductor test unit having the structure shown in FIG. 14. In the semiconductor test unit having the structure shown in FIG. 14, a multilayer circuit board 120 is held by a stage 122 instead of a vacuum attachment mechanism, and this multilayer circuit board 120 has no through-holes provided therein. Moreover, a pressing mechanism 123 is provided for pressing a semiconductor wafer 1. The other constituents are the same as those of the semiconductor test unit of FIG. 1. Here, the semiconductor wafer 1 and a contact board 5 are connected in such a manner that vias 6 of the contact board 5 are located at the positions facing electrodes 2 of the semiconductor wafer 1. Furthermore, electrode terminals 121 of the multilayer circuit board 120 and the vias 6 of the contact board 5 are aligned at the positions facing to each other to be pressed and fixed by the pressing mechanism 123.

A semiconductor wafer can be tested by conducting the steps of the sixth embodiment except for the step of activating a vacuum attachment mechanism, using the semiconductor test unit constituted described above.

According to the present modification, even if the electrodes of a semiconductor wafer, which is an examined electronic product, has inequalities in height or a semiconductor wafer is warped by its weight, it is possible to prevent the variation in contact area with the bumps of the contact board among the electrodes of a semiconductor wafer to obtain a stable test result, because the semiconductor wafer is pressed to the contact board with uniform vacuum attaching power over the entire semiconductor wafer surface where the electrodes are formed. Note that stresses on electrodes of an examined electronic product can be further buffered by selecting the optimum via shape for buffering stresses and utilizing a contact board having a via shape with a structure described in the second embodiment.

Seventh Embodiment

Figure 15A:
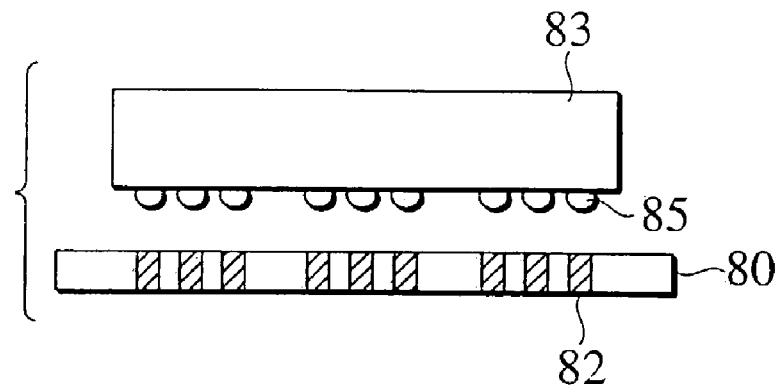
FIG. 15A is a cross-sectional view showing one step in a semiconductor device testing method according to a seventh embodiment of the present invention.

A method of testing a semiconductor device of the present embodiment will be described using FIGS. 15A to 15C. First, as shown in FIG. 15A, a semiconductor chip 83 having a plurality of solder bumps 85 formed on the bottom face thereof is prepared as an examined electronic product. Furthermore, a contact board 80 having a similar structure to that of the contact board in the first embodiment is prepared. This contact board 80 has a plurality of vias 82 formed therein. Note that the solder bumps 85 may be gold bumps.

Figure 15B:
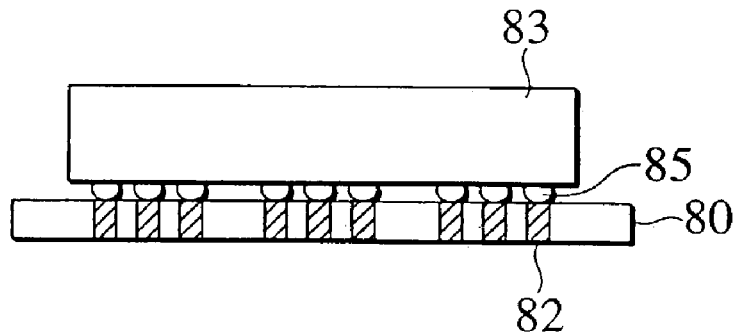
FIG. 15B is a cross-sectional view showing one step in the semiconductor device testing method according to the seventh embodiment of the present invention.

Next, as shown in FIG. 15B, the semiconductor chip 83 is connected to the contact board 80. In this case, alignment is performed so that the solder bumps 85 of the semiconductor chip 83 and the vias 82 of the contact board 80 may be located at the facing positions and be fused to be connected.

Next, similar to the sixth embodiment, a semiconductor chip is tested. That is, a test is conducted setting a semiconductor chip as an examined electronic product, instead of a semiconductor wafer in the sixth embodiment.

Figure 15C:
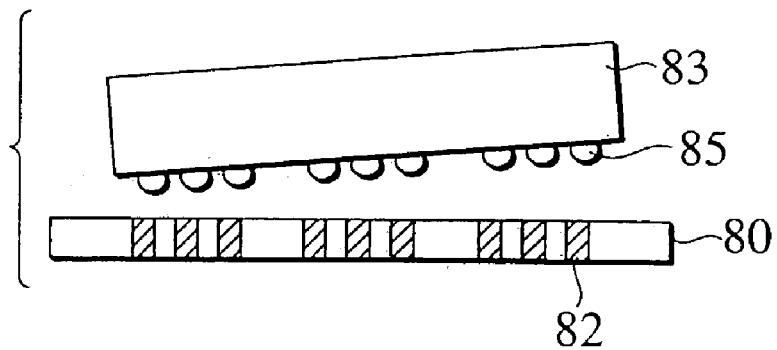
FIG. 15C is a cross-sectional view showing one step in the semiconductor device testing method according to the seventh embodiment of the present invention.

Next, as shown in FIG. 15C, the semiconductor chip 83 is pulled apart from the contact board 80. Here, the removed semiconductor chip 83 can be mounted on another board to be used when the removed semiconductor chip 83 has been confirmed to be a good product.

Here, the semiconductor chip 83 can be pulled apart with minimum damage to the solder bumps 85 after the test. This is because the contact board 80 has the shape of a porous sheet which is air-permeable, and the vias 82 are filled by plated copper in pores of the porous substance to be integrally coupled with the contact board 80. That is, in the case where an examined electronic product is joined with solder onto the vias 82 formed in such a manner that plated copper enters pores of the contact board 80, the copper in the vias remains there and solder is easily separated from the copper when an examined electronic product is removed. Since an examined electronic product can be easily removed from the contact board like this, damage to electrodes of the examined electronic product is small and the examined electronic product can be used as usual.

An examined electronic product and the contact board are attached with each other with solder. Therefore, if sufficient attaching strength can be obtained, dislocation does not occur in a test without vacuum attachment. Accordingly, a similar effect to that of Sixth Embodiment can be obtained by conducting a similar test to that of the modification of the sixth embodiment using the semiconductor chip and the contact board in the present embodiment without using a vacuum attachment device. Furthermore, a similar effect to that of the sixth embodiment can be obtained by conducting a similar test to that of the sixth embodiment using the semiconductor chip and the contact board in the present embodiment.

Eighth Embodiment

Figure 16A:
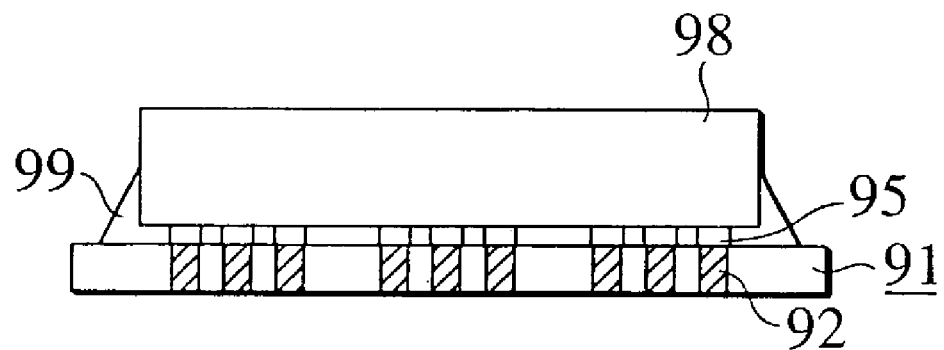
FIG. 16A is a cross-sectional view showing one step in a semiconductor device manufacturing method according to an eighth embodiment of the present invention.

A semiconductor device and a manufacturing method for the same of the present embodiment will be described using FIGS. 16A and 16B. As shown in FIG. 16A, a semiconductor chip 98 having a plurality of solder bumps 95 provided on the bottom face thereof is connected to a contact board 91. The contact board 91 has a similar structure to that of the contact board shown in the first embodiment. Vias 92 of the contact board 91 and solder bumps 95 of a semiconductor chip 98 are aligned at the facing positions and connected to each other. Next, instead of a semiconductor wafer, a semiconductor chip is tested similarly to the sixth embodiment. That is, after the fabrication of the semiconductor chip, the semiconductor chip is mounted on a contact board having vias which are concurrently used for a CSP substrate, and tested.

After the semiconductor chip 98 has been confirmed to be a good product from the test and then the semiconductor chip 98 and the contact board 91 are connected to each other as described above, the peripheral portion of the semiconductor chip 98 and the top face of the contact board 91 are covered with resin 99 having optimum physical property values. Here, since the contact board 91 is made of a porous sheet, the resin 99 is impregnated into pores of the porous substance. Thus, the resin 99 enters into the contact board 91, and the resin 99 and the contact board 91 are integrated with each other, thereby improving the adhesion strength between the contact board 91 and the semiconductor chip 98. Here, the optimum physical properties of the resin 99 include a thermal expansion coefficient and an elastic modulus, which are indices for improving the reliability of the package of a semiconductor device. The optimum solutions for the thermal expansion coefficient and elastic modulus of the contact board are determined by simulations in accordance with the size and thickness of the semiconductor chip. Thus, optimum resin can be used in plastic sealing.

Figure 16B:
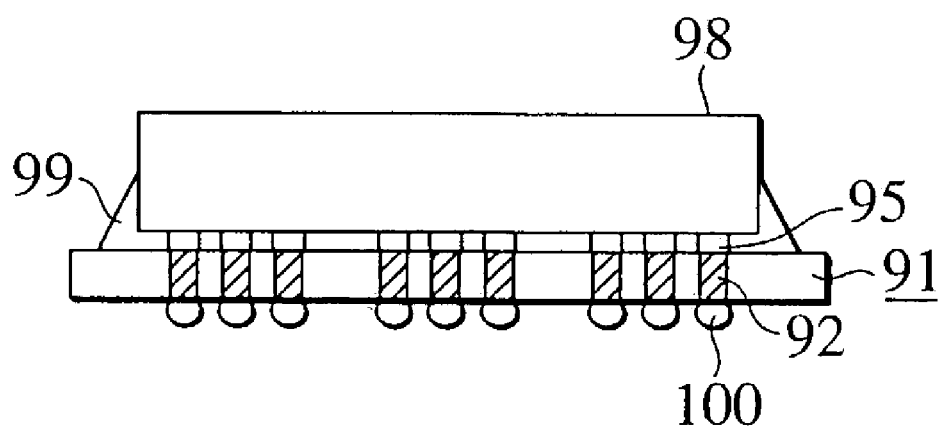
FIG. 16B is a cross-sectional view showing one step in the semiconductor device manufacturing method according to the eighth embodiment of the present invention.

Next, as shown in FIG. 16B, solder bumps 100 are connected to the respective vias 92 on the bottom face of the contact board 91, thus obtaining a semiconductor device. Note that the solder bumps 95 of the semiconductor chip 98 and the solder bumps 100 of the contact board 91 may be gold bumps. Thus, a chip scale package (CSP) type semiconductor device is obtained. Incidentally, an examined electronic product and the contact board are attached to each other with solder and resin. Therefore, if sufficient adhering strength can be obtained, dislocation does not occur in a test without vacuum attachment. Accordingly, the present embodiment can be conducted without using a vacuum attachment device.

According to the present embodiment, a semiconductor device having a high reliability package and a manufacturing method for the same can be provided by selecting resin having optimum physical properties in accordance with the characteristics of a semiconductor chip to fill the resin in a contact board.

According to the present embodiment, the number of manufacturing steps can be reduced by eliminating the step of removing a contact board connected to the semiconductor chip for a test from a semiconductor chip and the step of mounting the semiconductor chip on a CSP substrate.

Each embodiment can be combined with other embodiments to be conducted. In each embodiment, an examined electronic product may be a semiconductor chip previously cut out from a semiconductor wafer. In this case, a semiconductor device can be obtained without additional process after a completion of the test. Note that, though test unit and testing method for a semiconductor device and a contact board for a semiconductor device test have been described in each embodiment, each embodiment can be applied to the test unit and testing method for an electronic device and a contact board for an electronic device test.

Various modifications will become possible for those skilled in the art after receiving the teachings of the present disclosure without departing from the scope thereof.

What is claimed is:

1. A semiconductor test unit comprising:
   a test circuit for inputting/outputting a test signal to/from an examined electronic product;

a test signal wiring electrically connected to the test circuit;

a contact board electrically connected to an electrode of the examined electronic product and provided with a conductive via to which the test signal is transmitted, the contact board being made of an insulative porous material with air permeability and having top and bottom faces and a deformation suppression portion on the top face, the deformation suppression portion making the whole contact board have a thermal expansion coefficient within a range of ±6 ppm/K relative to that of the examined electronic product so that thermal expansion is suppressed;

a multilayer circuit board electrically connected to the conductive via and the test signal wiring, located below the bottom face of the contact board, and made of an insulative air-permeable material; and a vacuum attachment mechanism for attaching the examined electronic product, the contact board, and the multilayer circuit board thereto by vacuum, thereby holding the same.

2. A semiconductor test unit comprising:

a test circuit for inputting/outputting a test signal to/from an examined electronic product;

a test signal wiring electrically connected to the test circuit;

a contact board electrically connected to an electrode of the examined electronic product and provided with a conductive via to which the test signal is transmitted, the contact board being made of an insulative, porous, and air-permeable material and having top and bottom faces and a deformation suppression portion on the top face, the deformation suppression portion making the whole contact board have a thermal expansion coefficient within a range of ±6 ppm/K relative to that of the examined electronic product so that thermal expansion is suppressed;

a wiring circuit electrically connected to the test signal wiring and the conductive via and provided in a state where the wiring circuit is attached to at least any one of the top and bottom faces of the contact board; and a vacuum attachment mechanism for attaching the examined electronic product and the contact board thereto by vacuum, thereby holding the same.

3. The semiconductor test unit of claim 2, wherein the contact board is formed of the insulative and air-permeable material made of any one of PTFE, a liquid crystal polymer containing aramid, and polyimide, and has the top and bottom faces, the contact board having the conductive via therein for connecting the top and bottom faces.

4. The semiconductor test unit of claim 3, wherein the conductive via is formed by any one of plating and filling metal in the insulative, porous, and air-permeable material.

5. The semiconductor test unit of claim 4, wherein resin having arbitrary thermal expansion coefficient and elastic modulus is filled in the insulative, porous, and air-permeable material constituting a portion except for the conductive vias.

6. The semiconductor test unit of claim 3, wherein the conductive via is provided with a cavity, or top and bottom faces of the conductive via are connected by a coupling member.

7. The semiconductor test unit of claim 6, wherein the conductive via has any one of convex and concave shapes in accordance with a shape of any one of the electrode of the examined electronic product connected to the top face of the contact board and an electrode of a multilayer circuit board located under the bottom face of the contact board.

8. The semiconductor test unit of claim 3, wherein the contact board further has on any one of the top and bottom faces thereof a protruding portion essentially containing any one of resin, ceramic, and metal, the protruding portion surrounding the via in accordance with a form of arranging the electrode of the examined electronic product.

9. The semiconductor test unit of claim 2, wherein the deformation suppression portion is made of any one of metal and resin.

10. The semiconductor test unit of claim 2, wherein the deformation suppression portion comprises a metal selected from Cu, Ni, Au, and Sn.

11. The semiconductor test unit of claim 2, wherein the deformation suppression portion comprises any one of resins including epoxy resins, his-maleimide-triazine resin, PEEK resin, and butadiene resin; polyolefins including polyethylene and polypropylene; polydienes including polybutadiene, polyisoprene, and polyvinylethylene; acrylic resins including polymethylacrylate and polymethyl methacrylate; polystyrene derivatives; polyacrylonitrile derivatives including polyacrylonitrile and polymethacrylonitrile; polyacetals including polyoxymethylene; polyesters including polyethylene terephthalate, polybutylene terephthalate, and aromatic polyesters; polyallylates; polyamides including nylon and aromatic polyamides including aramid resins; polyimides; epoxy resins; aromatic polyethers including poly(p-phenylene ether); polyether sulfones; polysulfones; polysulfides; fluorinated polymers including polytetrafluoroethylene (PTFE); polybenzoxazoles; polybenzothiazoles; polyphenylenes including poly-p-phenylene; poly-p-phenylene vinylene derivatives; polysiloxane derivatives; novolak resins; melamine resins; urethane resins; and polycarbodiimide resins.

12. The semiconductor test unit of claim 2, wherein a material constituting the deformation suppression portion is any one of ceramics of metal oxides including silica, alumina, titania, and potassium titanate; silicon carbide; silicon nitride; and aluminum nitride.

* * * * *